United States Patent [19]

Laupman

[11] 4,057,767

[45] Nov. 8, 1977

[54] DEVICE FOR PROTECTING AN AUDIO AMPLIFIER AGAINST OVERLOAD OR SHORT CIRCUIT

[75] Inventor: Robert Ronald Laupman, Wijchen, Netherlands

[73] Assignee: Novanex Automation N. V., Netherlands

[21] Appl. No.: 702,901

[22] Filed: July 6, 1976

Related U.S. Application Data

[63] Continuation of Ser. No. 542,773, Jan. 21, 1975, abandoned.

[30] Foreign Application Priority Data

Jan. 24, 1974 Netherlands .......................... 7400977

[51] Int. Cl.$^2$ ............................................. H03F 21/00
[52] U.S. Cl. .................................. 330/207 P; 361/87; 361/100
[58] Field of Search ................ 330/207 P; 361/87, 100

[56] References Cited

U.S. PATENT DOCUMENTS

| | | | |
|---|---|---|---|
| 3,536,958 | 10/1970 | Sondermeyer | 361/91 X |
| 3,835,412 | 9/1974 | Honda et al. | 330/207 P |
| 3,890,465 | 6/1975 | Kaizu | 330/207 P X |

FOREIGN PATENT DOCUMENTS 45-32721  10/1970  Japan .......................... 330/207 P X

*Primary Examiner*—Lawrence J. Dahl
*Attorney, Agent, or Firm*—Diller, Brown, Ramik & Wight

[57] ABSTRACT

A device for protecting an audio amplifier against overload or short circuit. The device includes an output amplifier comprising a plurality of branches having output transistors, a preamplifier to control the output amplifier, and means for limiting the current through the transistors at an allowable value. The device further includes means which, when the current through the output transistors exceeds this value, limit this current at this value, and means which, in the presence of such an unallowably high current in one of the branches, immediately disconnect the output amplifier irrespective of the fact that this current occurs in the one or in the other branch.

5 Claims, 1 Drawing Figure

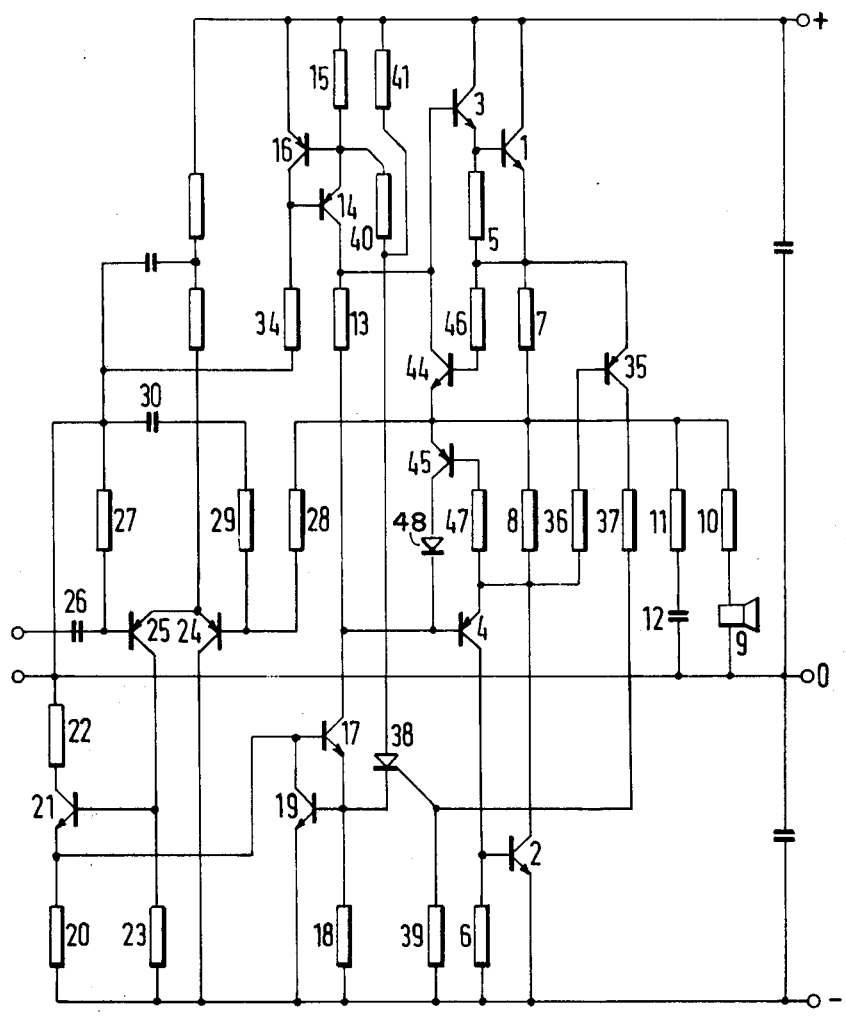

DEVICE FOR PROTECTING AN AUDIO AMPLIFIER AGAINST OVERLOAD OR SHORT CIRCUIT

This is a continuation of application Ser. No. 542,773 filed Jan. 21, 1975, now abandoned.

The invention relates to a device for protecting an audio amplifier against overload or short circuit, including an output amplifier comprising one or more current amplifier branches having output transistors and a preamplifier to control the output amplifier.

It is known that audio amplifiers comprising semiconductor devices may be realized with either a complementary or a quasi complementary output stage, which output stage may be adjusted either for class B operation wherein in the absence of an input signal the stage is nearly currentless, or for class AB operation wherein in the absence of an input signal a certain quiescent current flows.

As compared with amplifiers wherein electron tubes are used, such amplifiers comprising semiconductor devices show the great advantage of being surprisingly simple and having a high operational reliability. On the other hand such amplifiers comprising semiconductor devices suffer from a clear disadvantage, i.e. that if at the output an overload condition or short circuit occurs, even of a short duration, this results in immediate destruction of the output transistors provided in the output stage. Moreover, there is a great risk that at the same time other transistors preceding said output transistors will become permanently defective. Considering that, as a rule, the replacement of a defective transistor involves more complications than the replacement of a defective electron tube, said overload or short circuit at the output may result in time consuming and complicated replacement operations.

The consideration that short circuit or overload in the output circuit of a transistor amplifier of the kind described above can only result in transistors becoming defective if an input signal of sufficient magnitude is present at the input, has led to the measure known in this field of the art, i.e. to make provisions for the current amplifier branches of the output stage by means of which in each branch the current is limited to a still allowable maximum value.

Although it seem possible to realize short circuit-proof amplifiers in this known manner such a solution suffers from a great disadvantage as will be further explained.

In addition to a maximum current value also a maximum dissipation value is indicated for an output transistor. The supply voltage of the output transistors is preferably chosen so that during the normal operation and with a given output impedance the maximum current caused by operation at full capacity cannot exceed the indicated value, while moreover the then occurring dissipation does not exceed the maximum value. In such a design the maximum dissipation is even present during operation at a reduced capacity below full capacity.

As a rule, output transistors are constructed on the relationships mentioned above so that with specified maximum currents unambiguously limited maximum dissipations are indicated. Should one try to use such a transistor amplifier at the full capacity of the output transistors employed therein, difficulties arise when use is made of said current limiting devices. This may be explained as follows:

If the amplifier is dimensioned so that, when operated at full capacity, the maximum allowable current and, at any rate, the maximum dissipation are not exceeded, the current limiting device may be adjusted so that the amplifier, when operating at full capacity, is operating just below the adjusted maximum current and consequently distortions do not or hardly appear. If now an overload condition or short circuit takes place at the output, the failure of the prescribed output impedance value will cause a corresponding increase of the currents flowing through the output transistors. Then the current limiting device will become operative and provided it be correctly adjusted, the currents which occur will indeed not exceed the prescribed values. However, this cannot be said of the dissipations which occur in that case (overload or short circuit at the output). For, if the full supply voltage will be across the transistors without the original output impedance being series connected thereto, the dissipation will have a value which closely approaches the product of the adjusted maximum current and supply voltage.

Now, as a rule said product lies above the value allowable for the usual output transistors. Therefore, in order to eliminate said drawback it will be necessary to reduce the maximum capacity of the amplifier to such a low value that, only upon the occurrence of short circuit or overload at the output, the dissipation of the output transistors increases in such a manner that the specified maximum value is not exceeded.

This, however, means that under normal operating conditions the output transistors are loaded for only a part of the maximum capacity specified therefor. In practice this ratio proves to be well below 0.5.

Taking into account that, with such a construction, the cooling device of the output transistors must be dimensioned to suit the maximum dissipation caused by short circuit, this means that an amplifier protected in the manner described above will only produce half the capacity which it actually would be able to deliver.

It is an object of the invention to eliminate the disadvantages depicted above and to provide a device which makes it possible that such amplifiers indeed be capable of delivering their full capacity and that nevertheless they be completely protected against overload or short circuit.

More particularly it is an object of the invention to provide a device which does not suffer from the drawback inherent in the usual devices of this kind, i.e., that, if the preamplifier in the output stage is blocked, often a residual (hum) signal still remains so that currents may still occur.

Moreover, according to the invention, there is the consideration that under certain conditions not only an abrupt and complete short circuit but also a fluctuating short circuit may occur. Consequently, starting from said consideration it is important with such protections to realize that the occurring currents may vary very rapidly because during relatively short or relatively long times the output impedance may fail entirely.

The natue of the current variations occurring as a result of overload or short circuit also depends on the input signal presented to the amplifier. Current variations having steep edges are very difficult to be handled by output transistors and, moreover, in this connection the usual current regulating devices also involve problems because such current regulating devices tend to react in a somewhat delayed manner.

Consequently it is necessary to take measures so that in case of short circuit or overload the output transistors are subjected to such phenomena as short a period of time as possible. Thereupon is based the existing insight that still another device should be added to the current regulating device which rapidly disconnects the amplifier. Preferably the output transistors are subjected to such a rapid current increase, which is due to a short circuit or overload, only once per transistor in order to limit the risk of a short circuit to the utmost. Indeed, in this manner an appropriate connection is obtained to a physical property of virtually any semiconductor device, i.e. that during one cycle a substantially higher maximum current and maximum dissipation may be allowed than when said currents and dissipations are continued. The indicated current and dissipation values strongly decrease as the number of cycles increases and eventually arrive at values valid for a continued operation. Therefore output transistors are usually capable of a substantially higher maximum current and maximum dissipation, provided always the transistor concerned is subjected thereto only during some cycles, preferably one cycle.

To this end the device according to the invention is provided with means which, in response to a current increase which causes the current flowing through an output transistor to rise above the allowable value, limit the current to the allowable value concerned, and means which immediately decouple the output amplifier upon the occurrence of such a current excess in one of the amplifier branches of the output amplifier independent of the fact that the current excess occurs in the one or in the other current amplifier branch.

The dimensioning may be chosen such that the decoupling of the output transistors takes place within the fastest occurring half sinusodial wave which may be present in an audio amplifier and which is estimated at 10 to 20 microseconds.

The invention will be further explained with reference to the drawing representing an embodiment of the device according to the invention.

The amplifier shown in the drawing comprises an output amplifier having output transistors 1 and 2 with associated emitter-base-resistors 5 and 6 which are controlled by control transistors 3 and 4. The output transistors apply their current through measuring resistors 7 and 8 to a common output wherein a choke coil 10 and a loudspeaker 9 constitute the connection to the neutral conductor 0.

The output is bridged by an R/C member 11, 12. The bases of the transistors 3 and 4 are connected to a resistor 13 across which a constant voltage is substained by a current source formed by transistors 14 and 16 and resistors 15 and 34. Further the control transistors 3 and 4 are controlled by a transistor 17 which normally operates as an amplifier transistor but which upon the occurrence of overload or short circuit, forms with a transistor 19 and resistors 18 and 20 a current source when the maximum capacity is exceeded, which source, provided the value of the resistor 18 is chosen to be equal to half the value of the resistor 15, is capable of delivering a maximum current which is twice as large as the current of the current source 14, 15, 16, 34.

The latter is necessary in order to enable the amplifier to operate in two directions at the same operating capacity. The transistor 17 is controlled by differential amplifiers 24 and 25 by means of an auxiliary transistor 21 with associated damping resistor 22 in the collector path and the emitter-base-resistor 23; said amplifiers compare the input signal appearing at a resistor 27 through a capacitor 26, with the output signal divided through resistors 28 and 29.

The divider is connected through a capacitor 30 to the neutral conductor 0. From the output the current limiting transistors 44 and 45 regulate the maximum current which appears across the measuring resistors 7 and 8. For, if a too large current appears across the resistor 7, then such a voltage will be developed across said resistor 7 that across a resistor 46 the transistor 44 operates at its full capacity and the base of the transistor 3 prevents the transistor 3 from exceeding this value against the current supplied by the current source including the transistor 14. If the current across the measuring resistor 8 becomes too large, the voltage across said resistor 8 will increase in such a manner that through a resistor 47 the transistor 45 is operating at full capacity, which transistor through a diode 48 further controls the base of the transistor 4 against the maximum current which may be produced across the transistor 17 then acting as a current source.

However, under those circumstances wherein a too large current flows through the resistors 7 and 8 and consequently voltages are produced (which never happens at the same time) also a transistor 35 is operated at its full capacity through a resistor 36 and a thyristor 38 is fired through a limiting resistor 37. Said thyristor 38 is connected between the emitters of the current source transistors 17 and 14. The resistor 39 provides for a correct blocking in the condition of rest. When the thyristor 38 is fired a current is produced across a resistor 40 which flows off through the resistors 15 and 18, and through a resistor 41 a current is produced which moreover flows off only through the resistor 18. If the values of the resistors 40 and 41 are chosen so as to be equal the thyristor current will flow entirely through the resistor 18 and half the current will flow off through the resistor 15. As a result the transistors 17 and 14 are simultaneously blocked while the currents supplied by both current sources during said process decrease and finally assume a value 0. Now the output transistors 1 and 2 are "floating" and without carrying practically any current they are able to "freely" move between substantially the positive and the negative voltage + and −, and consequently also short circuited, to be locked on the potential of the neutral conductor 0.

As already stated above, it is this feature wherein the invention distinguishes itself fundamentally from all the systems wherein the preamplifier is blocked. In those systems often a residual (hum) signal still remains on the output stage so that currents still may occur.

Therefore according to the invention in a surprising manner use is made of the fact that the current direction in both resistors 7 and 8 is the same, a current flowing alternatively in said resistors which supplies information about the load of the associated output amplifier branches. Thus the maximum voltages appearing at the resistors 7 and 8 are alternating but are unidirectional.

When by means of the transistor 35 the voltage between the upper side of the resistor 7 and the lower side of the resistor 8 is read and it is realized that said resistors 7 and 8 are very small with respect to the input impedance of the transistor 35 with the associated base resistor 36, then one obtains alternatively information about the degree of load of both output amplifier stages.

It appeared that the choke coil 10 is not essential but with the R/C member 11, 12 theoretically increases the operation reliability by limiting the maximum di/dt occurring in the output transistors.

The firing of the thyristor 38 can be made visible by means of a small lamp or a LED (Light Lemitting Diode) by series connecting it to the resistor 40 or 41 or both and matching the resistance accordingly.

The resistor 41 may be omitted if the value of the resistor 40 is halved. This, however, results in a very large load on the base of the transistor 16.

The thyristor circuitry described above can also be used to switch the output stage currentless in case of a too high network voltage if either between the control electrode of the thyristor 38 and the neutral conductor 0 or between the control electrode and the positive conductor + a Zener diode is connected. In this manner a sharp definition is obtained.

Further it appears that if the output transistors 1, 2, 3 and 4 have some surplus value, the transistors 44 and 45 are no longer essential provided one uses a sufficiently fast transistor 35 and thyristor 38.

I claim:
1. In an audio amplifier circuit, the combination of:
a pair of output transistors and a pair of resistors, the collector-emitter circuits of said transistors being connected in series through said resistors and the junction of said resistors defining an output terminal of the amplifier;
control means connected to the base electrodes of said transistors for alternately biassing said transistors to conduct in accord with an audio input signal, said control means including first means responsive to voltage developed across one of said resistors for limiting the bias applied to one of said transistors, and second means responsive to voltage developed across the other of said resistors for limiting the bias applied to the other of said transistors; and
decoupling means connected across said resistors and responsive to a predetermined excess current through either one of said resistors for removing bias on said transistors.

2. In an audio amplifier as defined in claim 1 wherein said control means comprises a pair of current sources and a constant voltage source resistor connected in series therebetween, and said decoupling means includes a thyristor which blocks said current sources in response to said excess current.

3. In an audio amplifier as defined in claim 2 wherein said control means also includes voltage divider means connected to the base electrodes of said transistors and a pair of second transistors having their emitter-collector paths connected in series with said voltage divider means for variably biassing the base electrodes of said transistors first mentioned.

4. An audio amplifier having protection against overload or short circuit, comprising in combination:
a pair of current amplifier branches, each including an output transistor, the output transistor of one branch being connected in series with the output transistor of the other branch and a pair of output resistors in said series connection defining, at their juncture, an output terminal of the amplifier;
a pair of control transistors having their emitter-collector paths connected in series and a pair of control resistors in said series connection and being connected together through said output terminal, said control transistors being of opposite polarity types;
a constant current source and a preamplifier transistor connected in series and a constant voltage resistor in said series connection, one end of said constant voltage resistor being connected to the base electrode of one control transistor and the other end of said constant voltage resistor being connected to the base electrode of the outer control transistor, and input means connected to said preamplifier transistor for causing the voltage values at the opposite ends of said constant voltage resistor to vary in accord with an audio input signal;
the emitter-collector path of one control transistor being connected to the base electrode of one of said output transistors and the emitter collector path of the other control transistor being connected to the base electrode of the other output transistor, one output resistor being connected to one control transistor with the outer output resistor being connected to the other control transistor, and the control transistors circuit being current saturated when the voltage drop across either output resistor, as imposed on the associated control resistor, exceeds a predetermined value; and
decoupling means connected across said output resistors for disabling said constant current source and said preamplifier transistor when said predetermined value is exceeded.

5. An audio amplifier as defined in claim 4 wherein said decoupling means comprises a decoupling transistor connected across said output resistors and a thyristor controlled by said decoupling transistor, said thyristor being connected to said constant current source and said preamplifier transistor to disable same when said predetermined value is exceeded.

* * * * *